United States Patent [19]
Grabbe et al.

[11] Patent Number: 5,192,215
[45] Date of Patent: Mar. 9, 1993

[54] ELECTRICAL SOCKET FOR LEADED CHIP CARRIERS

[75] Inventors: Dimitry G. Grabbe, Middletown; Iosif Korsunsky, Harrisburg; Daniel R. Ringler, Elizabethville, all of Pa.

[73] Assignee: AMP Incorporated, Harrisburg, Pa.

[21] Appl. No.: 780,666

[22] Filed: Oct. 17, 1991

[51] Int. Cl.$^5$ .............................................. H01R 9/09
[52] U.S. Cl. ........................................ 439/73; 439/525
[58] Field of Search .................................. 239/68–73, 239/264, 331, 525, 526

[56] References Cited

U.S. PATENT DOCUMENTS

| | | | |
|---|---|---|---|
| 4,968,259 | 11/1990 | Korsunsky et al. | 439/73 |
| 5,007,845 | 4/1991 | Grabbe | 439/73 |
| 5,022,869 | 6/1991 | Walker | 439/526 |

Primary Examiner—Larry I. Schwartz
Assistant Examiner—Hien D. Vu
Attorney, Agent, or Firm—Allan B. Osborne; Bruce J. Wolstoncroft

[57] ABSTRACT

An electrical socket (10) for electrically connecting a leaded chip carrier (24) to a substrate is disclosed. The socket (10) includes a frame-shape base (12) with contacts (14) around the periphery of a central opening. Each contact (14) has a pair of outwardly extending, spaced apart arms (64,72) with one arm (72) having a recess (82) on an inside surface (80). The socket (10) also includes a cover (16) with locking members (18) around the periphery of a central opening. The locking members (18) include cantilever beams (90,92) which enter the space (74) between the contact arms (64,72) to press a lead (28) from the carrier (24) against one arm (64).

2 Claims, 4 Drawing Sheets

ELECTRICAL SOCKET FOR LEADED CHIP CARRIERS

FIELD OF THE INVENTION

The invention disclosed herein relates to an electrical socket for receiving a leaded chip carrier and electrically connecting the leads to circuits carried by a substrate.

BACKGROUND OF THE INVENTION

It is known that U.S. Pat. No. 5,007,845 provides a low height chip carrier socket having locking members in a cover for pressing leads from the carrier into a forced engagement with tuning fork contacts in the base of the socket. The locking members are four in number, one extending along the length of a given side of the cover and engaging all contacts positioned in a given side of the base. Although the contacts are stamped and formed and accordingly are identical in dimensions, positioning in the base and lead placement on the respective contacts may vary slightly within a given side. Thus, the individual locking members must be capable of effecting a good electrical engagement between the contacts and leads under less than ideal conditions. This creates a possibility the optimum performance may not always be obtained. Accordingly, it is now proposed to provide a low height chip carrier socket having a discrete, electrically isolated locking member for each contact and a re-designed contact to take advantage of the discrete locking members.

SUMMARY OF THE INVENTION

According to the present invention, an electrical socket is provided which includes a base with contacts surrounding a chip carrier receiving opening. The contacts include a pair of arms extending outwardly and having a space therebetween with one arm having a recess. The socket also includes a cover with discrete locking members surrounding a central opening. The locking members include a pair of cantilever arms which enter the space between the arms when the cover is placed on the base. One beam includes a heel portion which is received in the recess.

DESCRIPTION OF THE INVENTION

U.S. Pat. No. 5,007,845 to Grabbe is incorporated herein by reference.

Figure 1:
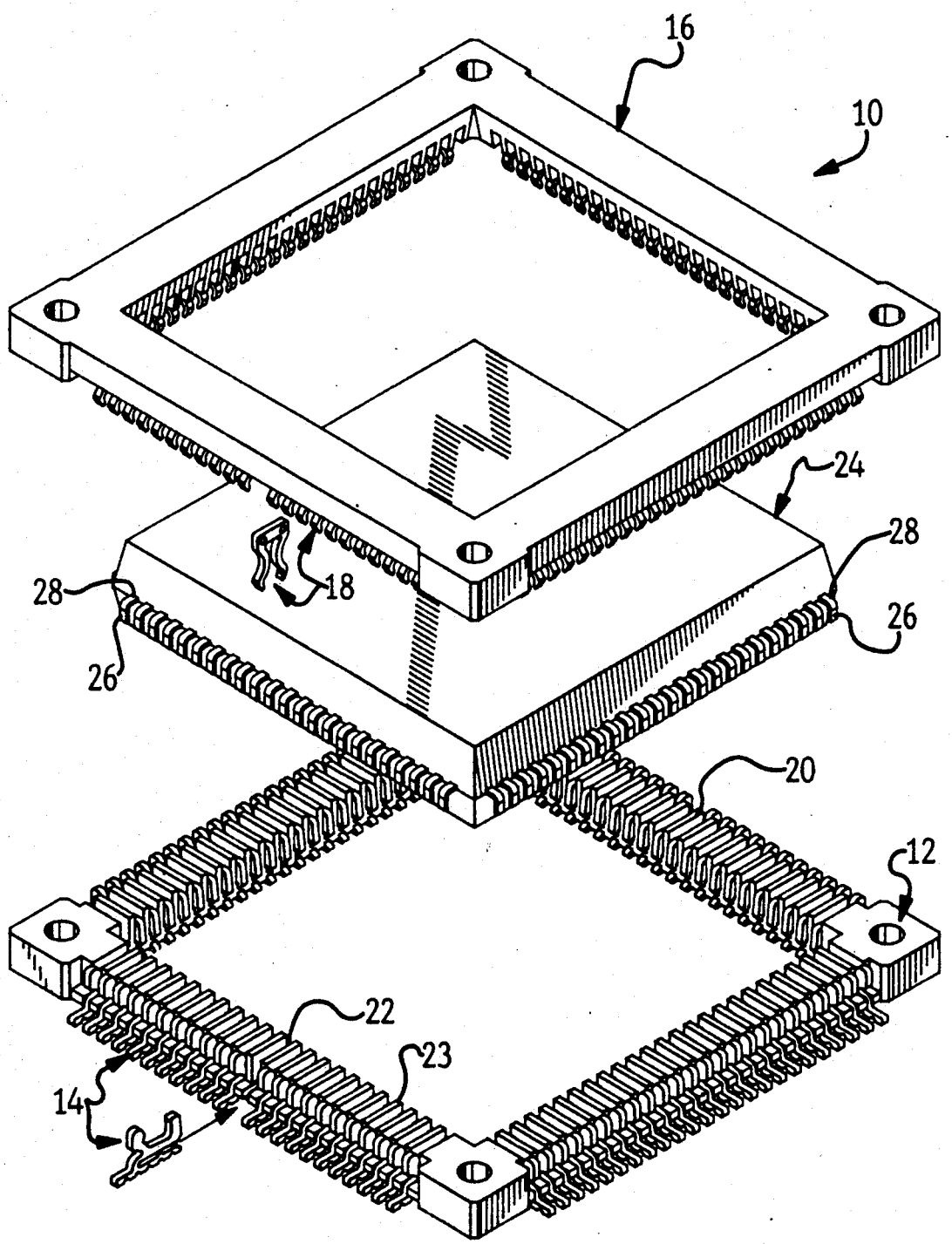
FIG. 1 is a view of a socket with the base and cover exploded out as well as one contact and one locking member and of a leaded chip carrier.

Shown in FIG. 1 is a frame-shaped base 12 of socket 10, contacts 14 carried by base 12, cover 16 and locking members 18 carried by cover 16. Generally the structure of the components of socket 10 are the same as for socket 25 disclosed in the '845 patent and therefore only the major differences will be discussed herein.

With regard to base 12, transverse walls 20 which define contact receiving slots 22 are solid; i.e., there are no grooves cutting through free edge surfaces 23 of walls 20.

A leaded chip carrier 24 is also shown in FIG. 1 with free ends 26 of leads 28 bent at an angle.

Figure 2:
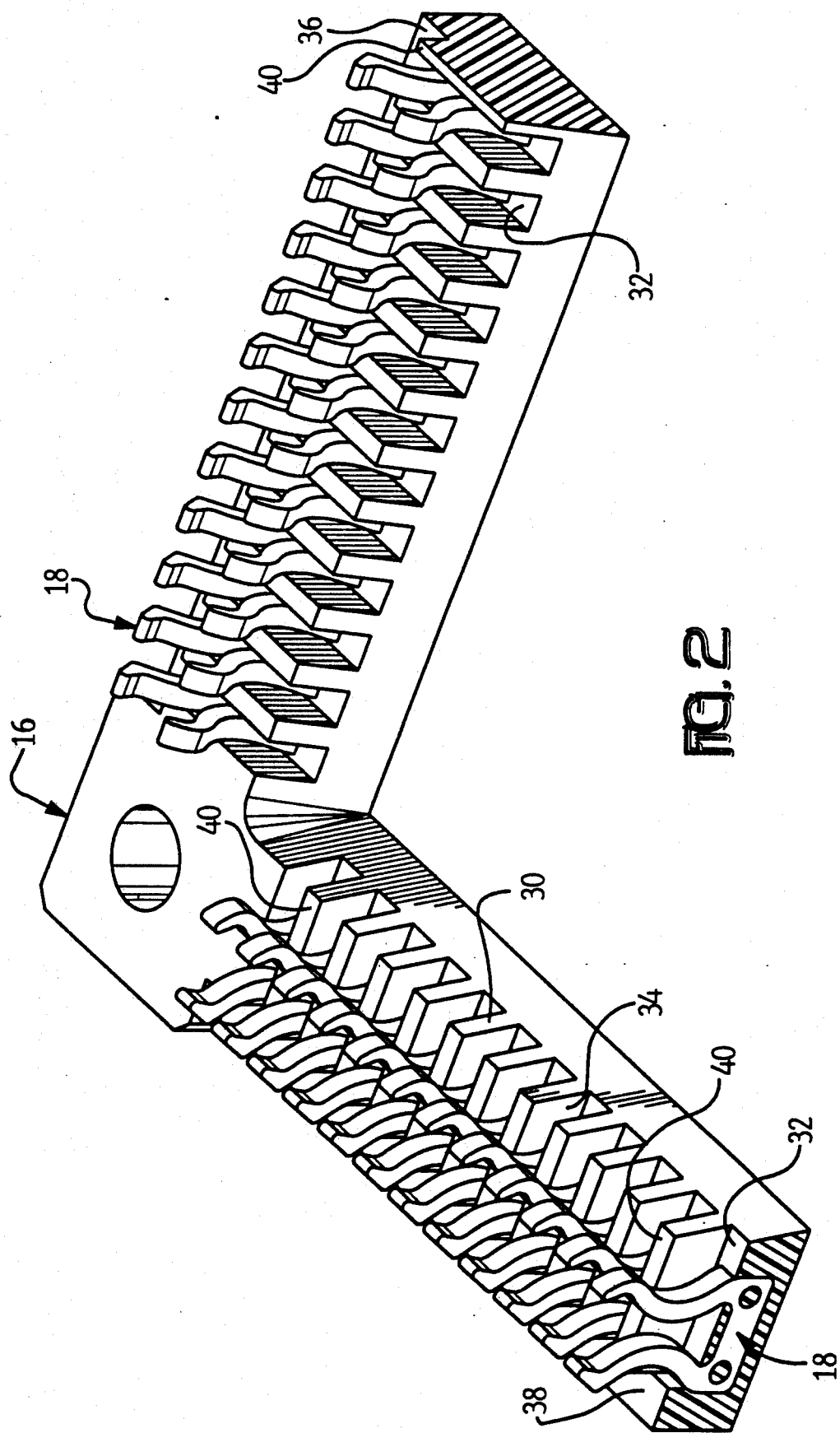
FIG. 2 is a partly sectioned view of an inverted cover showing the locking members and spacing walls.

With reference to FIG. 2, cover 16 has transverse walls 30 extending outwardly from surface 32. Walls 30 define slots 34 therebetween. A short skirt 36 extends outwardly from and normal to surface 32 and as shown, the free ends 26 of leads 28 are closer to surface 32 than are free edge surfaces 40 of transverse walls 30.

Figure 3:
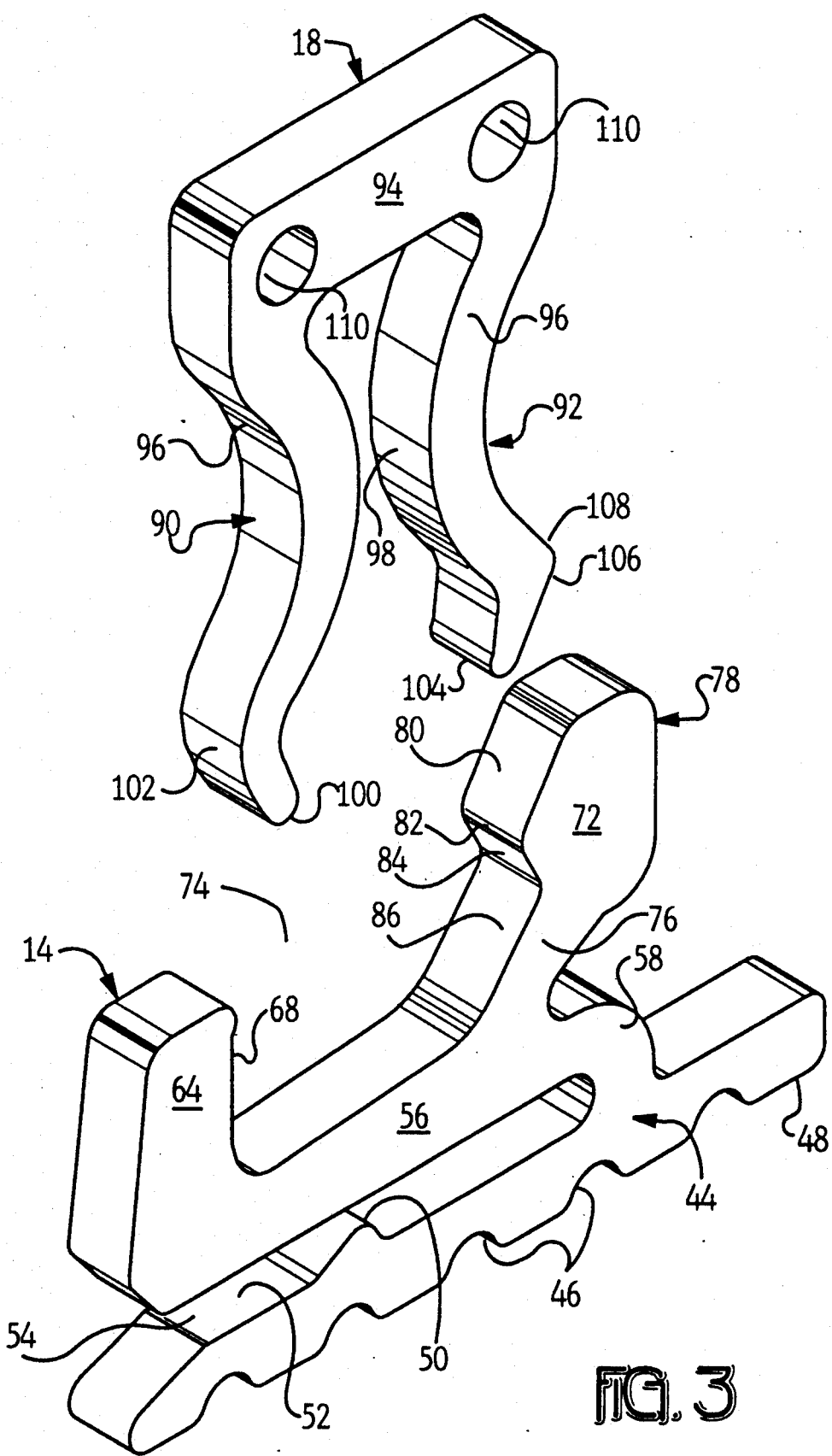
FIG. 3 is a view of a locking member and a contact.

Contact 14 and locking member 18 are shown in FIG. 3. Contact 14 is made by stamping and forming techniques well known in the art. A preferred material is copper alloy although other suitable conductive materials having similar spring characteristics may be used. Contact 14 includes an elongated base 44 having transverse grooves 46 on mounting surface 48 to provide periodic increased volumes of solder which increases the ductility. Further, since more solder is drawn in, there is less chance that bridging between adjacent circuit pads (not shown) will occur, a very real problem in high density substrates. Retaining knob 50 projects from opposite surface 52 of base 44 into space 54 defined by base 44 and bight portion 5 which overlies and is parallel to the base. Portion 56 is attached to base 44 by an arcuate-shaped strap 58.

Extending outwardly at a right angle to and from one end of portion 56 is arm 64 having an inside facing surface 68. At an opposite end of portion 56 arm 72 defines, in cooperation with arm 64, pocket 74. Arm 72 includes a lower portion 76 which is attached to and extends outwardly from portion 56 at about a forty-five degree angle relative thereto.

Upper portion 78 is parallel to opposite arm 64 with inside surface 80 thereon having a rounded nose 82 and recess 84. Below recess 84 is ramp surface 86. Both arms 64,72 are preferably rigid enough to withstand the tendency to spread apart under the expanding forces exerted by locking member 18.

Locking member 18 includes two resilient beams 90,92 extending outwardly from opposite ends of strap 94. In the illustrated embodiment, beams 90,92 include an arcuate section 96 with the convex surface 98 facing inwardly; i.e., towards each other. Free end 100 of beam 90 is arcuate shaped and oriented so that the rounded convex surface 102 faces outwardly. Free end 104 of beam 92 is also arcuate shaped and oriented so that convex surface 106 faces outwardly. Further, convex surface 106 includes a distinct heel portion 108.

The design of beams 90,92 as described above provide good resilient characteristics over a short length. However, beams 90,92 can, and it is being contemplated to make them in different configurations including one wherein the beams are straight.

Beams 90,92 are pre-loaded so that the distance between outside facing surfaces 102,106 is greater by a pre-determined amount than the width of pocket 74; i.e., the distance between surfaces 68,80 of arms 64 and 72.

As illustrated, strap 94 is provided with holes 110 near a juncture with respective beams 90,92. However, a single hole 110 is contemplated as well as a design wherein the strap includes lateral ears (not shown) which are completely encapsulated in the plastic material.

Contacts 14 are positioned in slots 22 with base floor 120 (FIG. 4) frictionally received in space 54 and knob 50 received in hole 122 in floor 120.

As illustrated locking members 18 are insert molded in cover 16 (FIG. 2) with beams 90,92 extending out between adjacent walls 30. As shown in FIG. 2, free ends 100,104 of beams 90,92 respectively, extend well beyond free edge surfaces 40 of walls 30.

Figure 4:
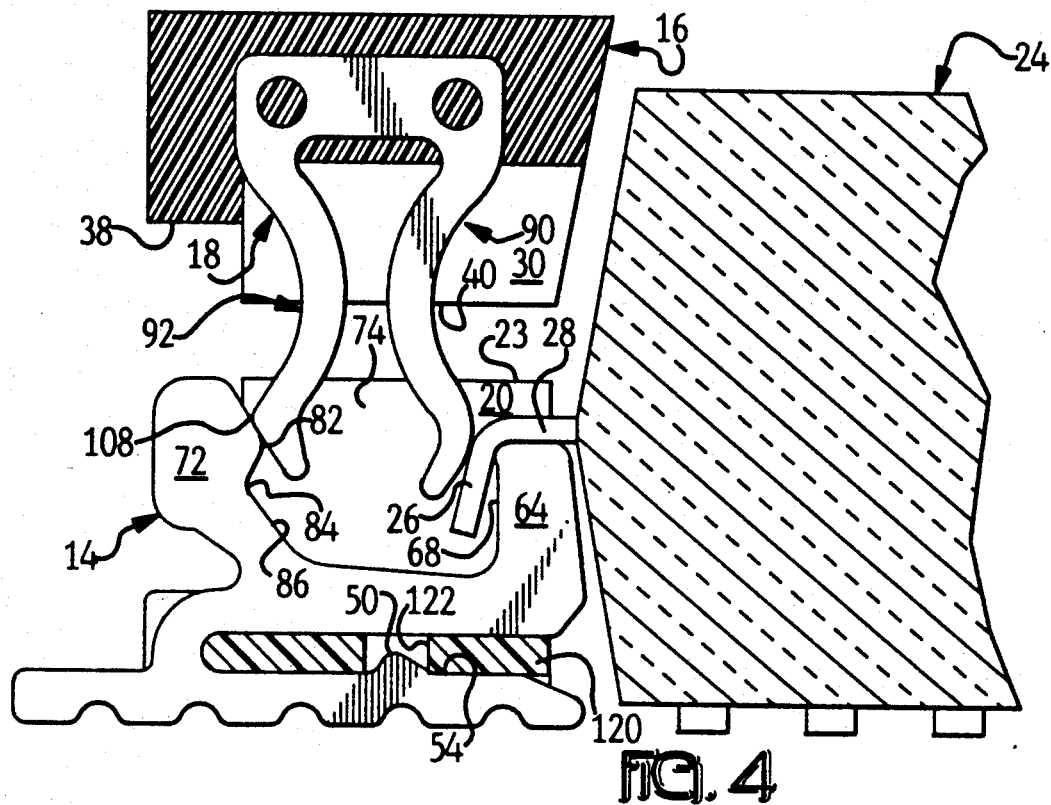
FIGS. 4 and 5 are sectioned views of the base and cover in the process of and after insertion of a locking member in a contact and the engagement of a lead of the chip carrier.
Figure 5:
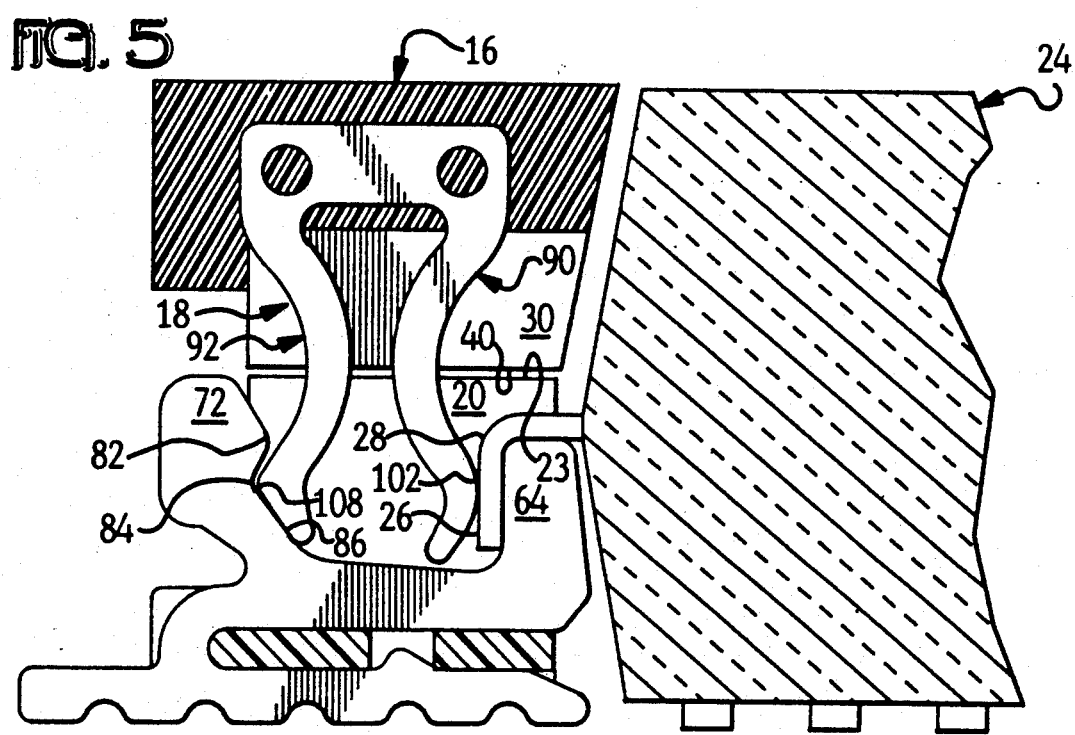

FIGS. 4 and 5 illustrate the positioning of locking member 18 in cover 16 to effect an electrical engagement between lead 28 of carrier 24 and contact 14 in base 12.

As beams 90,92 enter space 74, they engage and are forced inwardly towards each other by arms 64,72 of contact 14. Beam 90 slides along and forces free end 26 of lead 28 against inside surface 68 of contact arm 64. Beam 92 and more particularly heel portion 108 rides over nose 82 on contact arm 72 and into recess 84, as shown in FIG. 5 to lock contact 14 and member 18 together. In the final position shown in FIG. 5, member beams 90,92 are in compression so that the desired force required between lead free end 26 and contact arm 64 is maintained.

As noted above heel portion 108 is received in recess 82. However, if cover 16 is pushed down to where free edge surfaces 23,40 on transverse walls 20,30 respectively meet, heel portion 108 will be on ramp surface 86. However, beams 90,92 can and will tend to return to the original shape and drive heel portion 108 up ramp surface 84 and into recess 82.

Of the several advantages provided by the present invention, one is that the individual locking members 18 can be tailored with regard to resiliency to meet specific normal force requirements of individual contacts 14. For example, power carrying circuits perform better under higher normal forces than under such forces required for signal carrying circuits.

Another advantage of the present invention is that locking members 18 provide a second current path between lead 28 and circuits on a substrate (not shown). Such parallel paths are very beneficial in that self inductance is reduced by a factor of fifty percent (50%).

As noted above, locking members 18 in one embodiment contemplates insert molding as the way to load members 18 in cover 16. However, members 18 can be positioned in slots 34 in any one of a number of ways. Heat staking, thermo bonding and mechanical fasteners are just three of many method well known to those skilled in the art.

As noted above, locking members 18 made of conductive materials provide many advantages. However, members 18 made of non-conductive materials may also be used and thus it is not intended to limit members 18 to any specific type of material.

As can be discerned from the foregoing description, an electrical socket for leaded chip carriers has been disclosed. The socket includes contacts in a base and discrete locking members for each contact in a cover. The U-shaped locking members include a pair of spring beams extending outwardly from a strap. The beams enter in between and are compressed inwardly by a pair of arms on the contacts to press a lead from the chip carrier against one arm to effect an electrical engagement therebetween.

I claim:

1. A chip carrier socket for use with a leaded chip carrier, the chip carrier socket comprising:

a base having a chip carrier receiving opening, contacts positioned proximate the chip carrier receiving opening, the contacts have means for electrically engaging circuits on a substrate, arms extend outwardly from the contacts, each contact has a pair of spaced arms, respective arms have a recess provided on the inner surfaces thereof;

a cover with a discrete locking members extending therefrom, the discrete locking members have resilient cantilever beams which extend from the cover toward the base, each locking member has a pair of spaced apart cantilever beams, the cantilever beams are positioned in alignment with the arms of the contacts, respective cantilever beams have heel portions on outside surfaces thereof, the heel portions are configured to have a similar configuration to the recesses of the respective arms of the contacts;

whereby the heel portion of the respective cantilever beams are positioned in, and cooperate with, the recesses of the respective arms to provide a positive lock to insure that the cover is maintained in position on the base, and to insure that the positive electrical connection will be maintained between the chip carrier and the chip carrier socket.

2. A chip carrier socket for use with a leaded chip carrier, the chip carrier socket comprising:

a base with a chip carrier receiving opening provided therein, a plurality of contacts are positioned adjacent to the chip carrier receiving opening, the contacts have recesses provided in respective surfaces thereof;

a cover with discrete locking members, the cover is movable with respect to the base from an open first position to a closed second position, the locking members are provided in alignment with the contacts, the locking members have heel portions which are configured to have a similar configuration to the recess of the respective surfaces of the contacts, the heel portions are received in the recesses of the contacts;

whereby as the cover is moved from the first position to the second position, the heels of the locking members will engage the recesses of the contacts to secure the cover in position relative to the base.

* * * * *